United States Patent [19]
Kosco

[11] Patent Number: 5,793,236
[45] Date of Patent: Aug. 11, 1998

[54] DUAL EDGE D FLIP FLOP

[75] Inventor: Michael T. Kosco, Newport Beach, Calif.

[73] Assignee: Adaptec, Inc., Milpitas, Calif.

[21] Appl. No.: 766,892

[22] Filed: Dec. 13, 1996

[51] Int. Cl.$^6$ .......................... H03K 3/284; H03K 3/289
[52] U.S. Cl. ................................. 327/218; 327/212
[58] Field of Search ........................ 327/199–202, 327/211, 212, 215–218, 224, 225, 141, 144

[56] References Cited

U.S. PATENT DOCUMENTS

| | | | |
|---|---|---|---|
| 5,179,295 | 1/1993 | Mattison et al. | 327/199 |
| 5,250,858 | 10/1993 | Strong | 327/225 |
| 5,327,019 | 7/1994 | Kluck | 327/202 |

Primary Examiner—Timothy P. Callahan
Assistant Examiner—T. T. Lam
Attorney, Agent, or Firm—Christie, Parker & Hale, LLP

[57] ABSTRACT

An integrated circuit provides for doubled data throughput by clocking data on both edges of an attached clock signal. The circuit includes an upper latch stack, responsive to the clock rising edge, and a lower latch stack responsive to the clock falling edge, each latch stack outputting a respective set and clear signal. An active overlap filter logically ORs the set and clear signals from the upper and lower latch stacks to a third set and clear signal which controls operation of an output latch. Data lines are connected to the upper and lower latch stacks, such that a first data signal is clocked to the circuit output during a clock rising edge transition and a second data signal is clocked to the output during a clock falling edge transition. Filter circuitry between the latch stacks and the output latch ensures that set and clear are not asserted simultaneously, thus providing for "glitch" free operation of the circuit.

19 Claims, 5 Drawing Sheets

*FIG. 1*

*PRIOR ART*

| Time | t1 | t2 | t3 | t4 | t5 | t6 | t7 | t8 | t9 | t10 |
|---|---|---|---|---|---|---|---|---|---|---|
| Reset | ↑ | ↓ | 0 | 0 | 0 | 0 | 0 | 0 | 0 | 0 |
| Clk | 0 | 0 | ↑ | ↓ | 0 | ↑ | ↓ | ↑ | 1 | ↓ |
| DI | 0 | 0 | 0 | 0 | ↑ | 1 | 1 | 1 | 1 | 1 |
| D0 | 0 | 0 | 0 | 0 | 0 | 0 | 0 | 0 | ↑ | 1 |
| U1 | 0 | 0 | 0 | 0 | ↑ | 1 | 1 | 1 | 1 | 1 |
| U2 (D1Set) | 1 | 1 | 1 | 1 | 1 | ↓ | ↑ | ↓ | 0 | ↑ |
| U3 (D1Clr) | 1 | 1 | ↓ | ↑ | 1 | 1 | 1 | 1 | 1 | 1 |
| U4 | 1 | 1 | 1 | 1 | ↓ | 0 | 0 | 0 | 0 | 0 |
| U5 | 0 | 0 | 0 | 0 | 0 | 0 | 0 | 0 | ↑ | 1 |
| U6 (D0Set) | 1 | 1 | 1 | 1 | 1 | 1 | 1 | 1 | 1 | ↓ |
| U7 (D0Clr) | 0 | 0 | ↑ | ↓ | 0 | ↑ | ↓ | ↑ | 1 | 1 |
| U8 | 1 | 1 | 1 | 1 | 1 | 1 | 1 | 1 | ↓ | 0 |
| U9 (Set) | 1 | 1 | 1 | 1 | 1 | 0 | 1 | 0 | 0 | 0 |
| U10 (Clr) | 0 | 0 | 0 | 0 | 0 | 1 | 0 | 1 | 1 | 1 |
| LatchSet | 1 | 1 | 1 | 1 | 1 | 0 | 1 | 0 | 0 | 0 |
| LatchClr | 0 | 0 | 0 | 0 | 0 | 1 | 0 | 1 | 1 | 1 |
| Q | 1 | 1 | 1 | 1 | 1 | D1 | D0 | D1 | D1 | D0 |
| Q_ | 0 | 0 | 0 | 0 | 0 | $\overline{D1}$ | $\overline{D0}$ | $\overline{D1}$ | $\overline{D1}$ | $\overline{D0}$ |

DUAL EDGE D FLIP FLOP

FIELD OF THE INVENTION

In general, the invention relates to the field of clocked integrated circuit data fli flops; more particularly, it relates to such a clocked flip flop that provides for doubled data throughput by clocking data on both edges of the clock signal.

BACKGROUND OF THE INVENTION

Extensive research efforts in the field of synchronous integrated circuits for many years have been directed to developing practical techniques for increasing their speed and data throughput. Improved techniques for increasing speed have been an important enabling factor in the trend toward faster and more capable electronic circuits such as computers.

Circuit speed or, alternatively, data throughput is commonly expressed in terms of the speed or frequency of a synchronous clock signal; analytically, it is the rate at which a clock signal may be repeated given the inherent switching speed of a particular integrated circuit technology. Although the trend in recent years has been to continually reduce the size of individual transistors, thus increasing the switching capabilities of integrated circuits, the requirement for ever greater data throughput in modern computer systems has outpaced the capabilities of the semiconductor technologies from which such components are built.

It will be seen that greater data throughput is necessary when considering the vast amount of data which needs to be communicated among and between various components of a computer, in modem full-motion video, high-density graphics, and Internet related applications. Indeed, the data rate capabilities of conventional integrated circuits are a limiting factor in full-motion video data processing.

Prior art data latches have included various known types of clock triggered flip flops. Pertinent such flip flops include D-type positive edge triggered flip flops such as the SN5474/ 7474 Dual D-type Positive Edge Triggered Flip Flop With Preset and Clear, manufactured and sold by Texas Instruments Corporation of Dallas, Tex.

Figure 1:
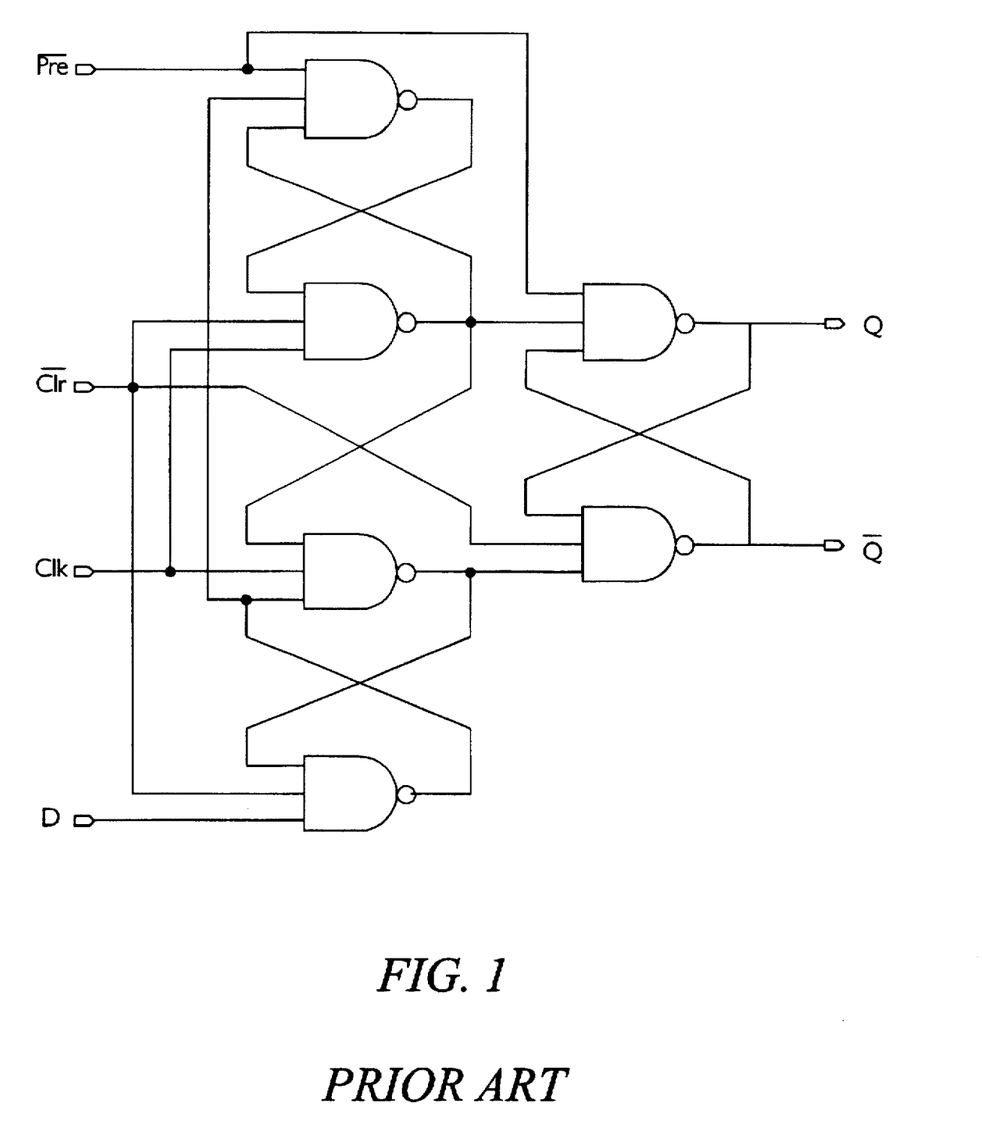
FIG. 1 is a schematic, logic-level diagram of a dual D-type positive edge triggered flip flop according to the prior art.

Such a D-type positive edge triggered flip flop is depicted in FIG. 1 and is typically provided in a package which may contain 1, 2 or 4 independent D-type positive edge triggered flip flops. As can be seen from the circuit of FIG. 1, a logic low at the preset or clear inputs will set or reset the outputs regardless of the logic level of the other inputs. When the preset and clear inputs are at a logic high level, data at the D input which meets the setup time requirements is latched to the outputs on the rising (positive-going) edge of the clock signal. As is well understood by those in the field of integrated circuit design, data at the D input may then be changed without effecting the logic levels at the outputs, so long as circuit set-up and hold times are not violated.

Such a flip flop, while relatively simple to manufacture and operate, has a data throughput rate which is limited in two respects; the first by the circuit set up and hold times which preclude data from being too rapidly changed, and the second by the speed of the clock. Conventional flip flops which are triggered only by either the positive going or negative going edge of a clock signal have a data throughput rate no greater than the clock frequency.

Doubling the data rate by, for example, combining a positive edge triggered flip flop with a negative edge triggered flip flop would result in a highly complex circuit because of the need to multiplex their respective outputs. While technically feasible, such multiplex circuits are often highly unstable and cause unacceptable "glitches" or false signal pulses with sufficient frequency so as to corrupt the resulting data stream.

Accordingly, there is a demonstrated need for an integrated circuit flip flop which is able to latch data to the outputs at a rate double that of the clock frequency. Such a flip flop should be operatively responsive to both the positive going and the negative going edge of a controlling clock and in addition, operate to provide such a doubled data stream without "glitches" or signal level instabilities.

SUMMARY OF THE INVENTION

The present invention describes an improved dual clock edge triggered D-type flip flop for clocking two data streams to an output latch at a rate double that of the clock frequency. In accordance with the present invention, the two data streams may be independent or alternatively, the two data streams may be tied together so as to form a single data stream.

In one aspect of the invention, an integrated circuit for latching data in operative response to alternating rising and falling edge transition of a clock signal comprises a first latch stack connected to receive a first data signal on a first data input and a second latch stack connected to receive a second data signal on a second data input. Each latch stack respectively produces a pair of output signals; DxSet__ and DxClr__.

A filter circuit logically combines the DxSet__ and DxClr__ output signals from the first and second latch stacks to form thereby a Set__ and Clr__ signal. An output latch is operatively responsive to the Set__ and Clr__ signals and includes a pair of complimentary outputs, Q and Q__. Data on the first data input is latched to the output on the rising edge transition of the clock while data on the second data input is latched to the output on the falling edge transition of the clock.

In another aspect of the invention, the filter comprises a first and second logical ORing function. The first logical ORing function combines respective ones of the first set signals to cause production of the third set signal. The second logical ORing function combines respective ones of the second clear signals to cause production of the third clear signal.

In a further aspect of the invention, the first output is Set__ and the second, complimentary output, is cleared when the Set__ input is asserted and the Clr__ input is not asserted. Additionally, the second output is set and the first, complimentary output, is cleared when the Clr__ input is asserted and the Set__ input is not asserted. In this aspect of the invention, the filter includes means for preventing the Set__ input and the Clr__ input to the output latch from being asserted simultaneously.

BRIEF DESCRIPTION OF THE DRAWINGS

These and other features, aspects, and advantages of the present invention will be more fully understood when considered with respect to the following detailed description, appended claims, and accompanying drawings, wherein:

DETAILED DESCRIPTION OF THE PREFERRED EMBODIMENT(s)

Figure 2:
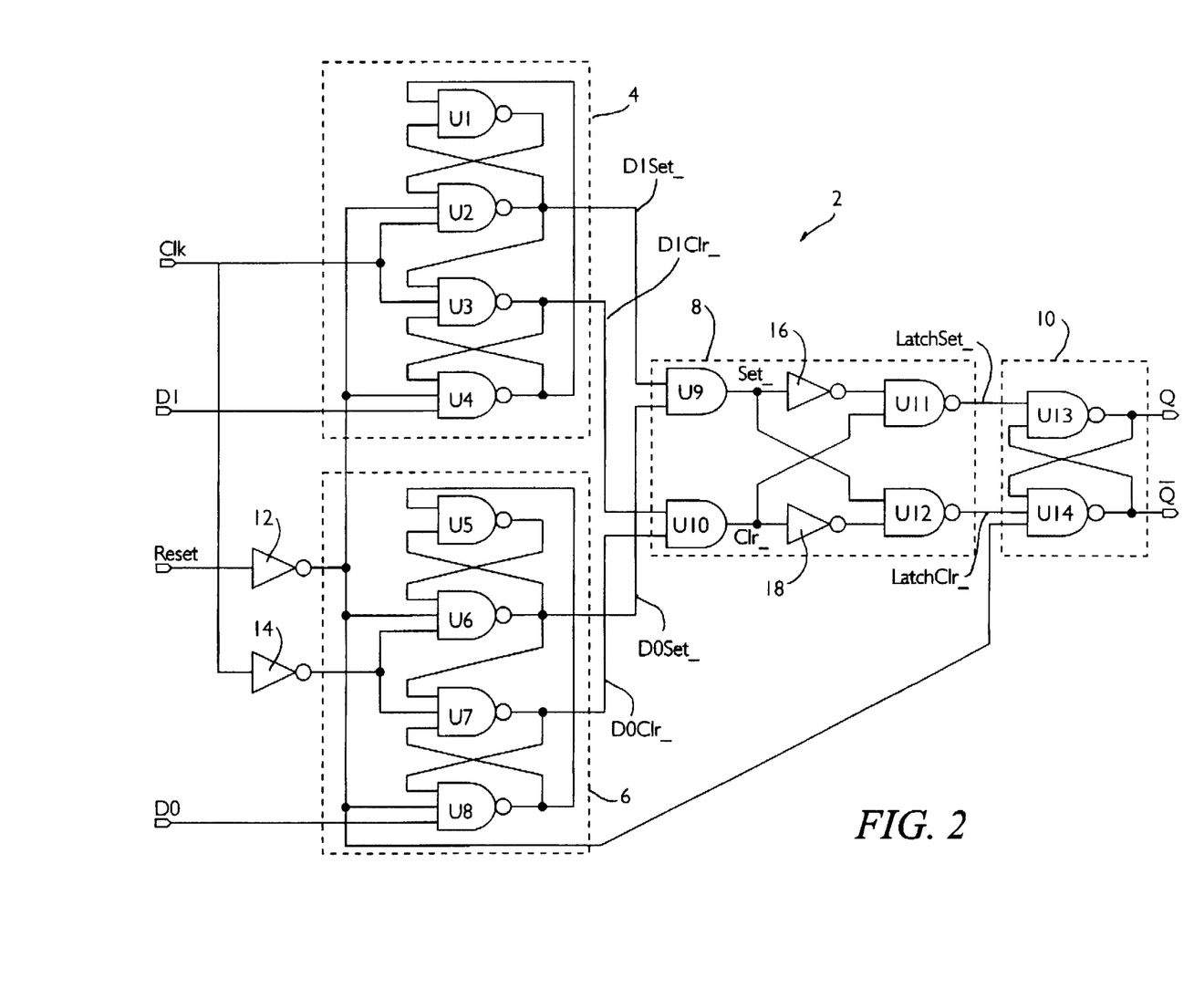
FIG. 2 is a schematic, logic-level circuit diagram of a dual clock edge triggered D-type flip flop in accordance with the present invention.

FIG. 2 depicts a schematic, logic-level circuit diagram of a dual clock edge triggered D-type flip flop circuit in accordance with practice of principles of the present invention. The circuit generally indicated at 2, is adapted for enhancing data throughput, through the circuit, by clocking data on both the rising and the falling edge of a binary-type controlling clock signal denoted herein as Clk. The circuit 2 in accordance with the invention suitably comprises an upper latch stack 4, coupled to a first data input D1 and a lower latch stack 6 coupled to a second, separate data input D0. The upper and lower latch stacks (4 and 6) are configured to provide toggling inputs to an active overlap filter circuit 8 which is in turn, coupled to an output latch 10 which provides a pair of mutually exclusive outputs Q and Q_. It should be mentioned herein, that an underscore (_) following a signal designation, denotes that signal as an active low signal, in accordance with recognized convention.

In addition to being connected to respective data inputs D1 and D0, the upper and lower latch stacks (4 and 6) are also coupled to a common reset signal (Reset) through an inverter 12, which reset signal is also connected through the inverter 12 to the output latch 10. A clock signal, Clk, is directly connected to the upper latch stack 4, and connected to the lower latch stack 6 through an inverter 14, thus providing the upper and lower latch stacks with mutually exclusive clock triggering edges, i.e. as the upper latch stack 4 experiences a clock rising edge, the lower latch stack 6 will experience a clock falling edge.

In accordance with practice of the present invention, the circuit 2 is configured to double the data throughput through the device without doubling the traditional clock rate. It accomplishes this objective by clocking data onto the outputs Q and Q_ on both edges of the clock signal, in accordance with the following truth table:

TRUTH TABLE #1

| Reset | Clk (clock) | Q  | Q_  |
|-------|-------------|----|-----|
| 1     | X           | 0  | 1   |
| 0     | ↑           | D1 | D1_ |
| 0     | ↓           | D0 | D0_ |

From the preceding table it can be seen that the rising edge of the clock signal will clock the digital value of the data signal D1, through the upper latch stack 4 and onto the Q output, while its inverse digital value D1_ appears on the Q_ output. Conversely, on the falling edge of the clock signal, the digital value of the D0 input is clocked through the lower latch stack 6 to the Q output, while its inverse D0_ appears on the Q_. As will be further evident from the discussion of the construction and operation of the exemplary embodiment of the circuit below, the D0 and D1 inputs may be tied together to form a single input signal (D), whereby the functional truth table would appear as follows:

TRUTH TABLE #2

| Reset | Clk (clock) | Q | Q_ |
|-------|-------------|---|----|
| 1     | X           | 0 | 1  |
| 0     | ↑           | D | D_ |
| 0     | ↓           | D | D_ |

In either case, it will be evident to one having skill in the art, that data throughput is doubled through the circuit of the present invention, either by having dual data inputs being multiplexed by rising and falling clock edges as in Table 1, or by having a single ended data input being directly strobed to the outputs by both the rising and falling edges of the clock signal as in Table 2.

CONSTRUCTION OF THE CIRCUIT

As is shown in FIG. 2, the dual clock edge triggered circuit 2 comprises upper and lower latch stacks (4 and 6) which are generally constructed as mirror images of one another. Upper latch stack 4 suitably comprises 4 NAND gates, U1, U2, U3 and U4. For purposes of clarity, the cardinal order of the inputs of each of the NAND gates will be described from the perspective of the logic-level diagram of FIG. 2, i.e., the first input of NAND gate U1 is the upper input from the perspective of the figure.

U1 is a two-input NAND gate with its first input being taken from the output of U4, and its second input being taken from the output of U2. U2 is a three-input NAND whose first input is cross-coupled to the output of U1. A reset signal is connected through an inverter 12 and provides the second input to U2, the third input to which is connected to the clock (Clk). The output of U2 is denoted D1 Set_, and provides a first output from the upper latch stack 4, as well as the first input to a three-input NAND gate U3. The clock signal is connected to the second input of U3 and the output of U4 is connected to the third input. The output of U3 is denoted as D1Clr_, and provides a second output of the top latch stack 4, as well as the first input to a three-input NAND gate U4. The reset signal is connected to the second input of U4 through the inverter 12, and the third input of U4 is connected to the upper latch stacks data input D1. As was described above, the output of U4 is cross-coupled to the third input of U3 and to the first input of U1.

In like manner, the lower latch stack 6 comprises four NAND gates, U5, U6, U7 and U8, configured in generally mirror-image fashion to the four NAND gates of the upper NAND latch stack 4. In particular, U5 corresponds to U1, U6 corresponds to U2, U7 corresponds to U3, and U8 corresponds to U4. Accordingly, U5 is a two input NAND whose first input is taken from the output of U8, and whose second input is taken from the output of U6, a three-input NAND. The output of U5 is cross-coupled to the first input of U6, whose second input is connected to reset through the inverter 12. The third input of U6 is connected to the clock signal, however, in the case of the lower latch stack 6, the Clk signal is coupled through an inverter 14 which reverses the phase of the clock. The output of U6 is denoted D0Set_ and provides the first output of a lower latch stack 6, as well as the first input to a three-input NAND gate U7. The second input of U7 is connected to the clock signal through the inverter 14, while the third input is cross-coupled to the output of the three-input NAND gate U8. The output of U7 is denoted as D0Clr__, and provides the second output of the lower latch stack 6, as well as the first input to U8. U8's second input is connected to reset through the inverter 12, while the third input to U8 is connected to the lower latch stack's data input D0.

Having further reference now to FIG. 2, the outputs of the upper and lower latch stacks, 4 and 6 are provided as inputs to the control and instability protection logic circuitry 8 (termed herein the protect logic circuitry). The protect logic circuitry 8 suitably comprises a pair of two-input AND gates, U9 and U10, where U9 has its inputs connected to D1Set__ and D0Set__ to provide an active high output signal denoted Set__. U10 has its inputs connected to D1Clr and D0Clr__, and provides an active high output signal denoted Clr__. As can be seen in FIG. 2, the Set__ output of U9 is directly connected to a first input of a two-input NAND gate U12, and is connected through an inverter 16 to a first input of a two-input NAND gate U11. Likewise, the Clr__ output of U10 is directly connected to the second input of U11, and connected through an inverter 18 to the second input of U12. The output of U11 is an active low signal denoted as LatchSet__, the output of U12 is also an active low signal, denoted herein as LatchClr__. The cross-coupling of the Set__ signal as the direct input into U12 and an inverted input into U11 and the direct input of Clr__ into U11 and an inverted input into U12, enables the protect logic circuitry 8 to provide LatchSet__ and LatchClr__ output signals which are completely free of instability. In a manner to be described in greater detail below, the LatchSet__ output of U11, for example, will not change state until both Set__ and Clr__ have stabilized.

Output latch 10 is a conventional latch comprising a pair of NAND gates U13 and U14 connected, respectively to LatchSet__ and LatchClr__. In addition, the output of U13 is cross-coupled to the first input of U14, while the output of U14 is cross-coupled to the second input to U13. In the exemplary embodiment of the circuit of the present invention, U14 is configured as a three-input NAND gate with its third input connected to reset through the inverter U12. The active low output of U13 defines the Q output of the circuit 2, while the Q__ output is defined by the active low output of U14.

OPERATION OF THE CIRCUIT

Prior to describing operation of the circuit 2 of FIG. 2, it is necessary to describe the operation of the active overlap filter circuitry 8 and the output latch 10. As will be recognized by one having skill in the art, output latch 10 is a conventional cross-coupled latch having two active low inputs, LatchSet__ and LatchClr__ (ignoring for the moment the Reset line), and two complimentary outputs, an active high Q and an active low Q. The output latch 10 operates in conventional fashion, with the Q output being set to a 1 state, and Q being cleared to a 0 state, when LatchSet__ is asserted (in the context of the exemplary embodiment, because LatchSet__ is an active low signal, it is asserted when it goes low, or true). Likewise, the Q__ output is set to a 1 state, and the Q output is cleared to a 0 state, when the LatchClr__ input is asserted (goes low, or true). In addition, one having skill in the art will understand that when neither LatchClr__ nor LatchSet__ are asserted (i.e., both signals are a 1, or false), both the Q and Q__ outputs remain in whatever previous state they were set or cleared to during the previous cycle. Also, it is well known that when both LatchClr__ and LatchSet__ are asserted (i.e. both are low, or true), both the Q and Q__ outputs will be indeterminate (conventionally denoted as an X symbol).

Figure 6:
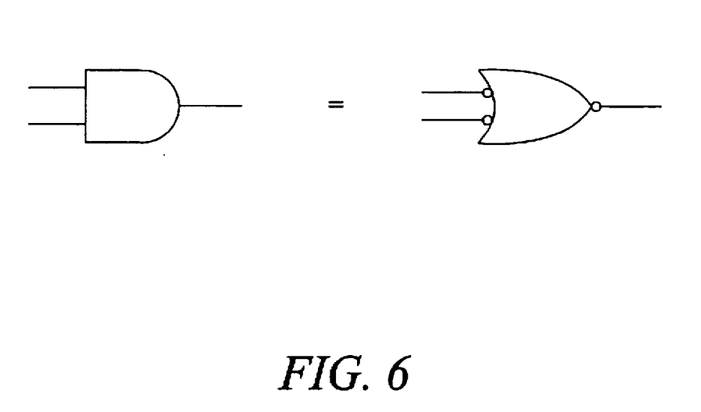
FIG. 6 is a logic diagram of a two-input AND gate and a two-input, fully buffered OR gate, indicating their equivalence.

Moving now to the active overlap filter circuitry 8, it will be seen that the two AND gates U9 and U10 function to logically OR the D0Set__ and D1Set__ inputs onto an internal Set__ node, and the D0Clr__ and D1ClR__ inputs onto an internal Clr__ node respectively. Those having skill in the art will understand, from the illustration of FIG. 6, that a two-input AND gate is equivalent to a two-input, fully buffered OR gate, i.e., an OR gate with both of its inputs and its output inverted. Thus, an AND gate is able to perform a logical ORing function. In the exemplary embodiment of FIG. 2, the Set__ node is directly coupled, as the first input, to NAND gate U12, while the Clr__ node is directly coupled to the second input of NAND gate U11. Also, the Set__ node is coupled through an inverter 16 to the first input of NAND gate U11, while the Clr__ node is coupled through inverter 18 to the second input of NAND gate U12. Thus, it will be understood that when the Set__ and Clr__ nodes are in opposite states, only one of the NAND gates (U11 or U12) will transition to an active low (or true), while the other NAND gate is in a high (or false) state. For example, if the Set__ node is a 1 and the Clr__ node is a 0, this will cause two 0's to appear at the input of U1 1, causing its output (LatchSet__ to be false (i.e., a 1). Likewise, two 1's are caused to appear at the inputs of NAND gate U12, thus causing its output (LatchClr__) to be 0 (i.e. true), thus causing the output latch to be cleared.

It will also be readily understood that when the states of Set__ and Clr__ are reversed, i.e., Set__ is 0 and Clr__ is 1, LatchSet__ will be asserted to a 0 state, while LatchClr__ will be driven to a 1, thus setting the output latch. It will also be understood that when the Set__ and Clr__ nodes are in the same state, i.e., both true (1) or both false (0), LatchSet__ and LatchClr__ will both be driven to a 1, or false, state. It will also be evident to one having skill in the art of logical circuit design, that no condition may obtain with respect to the Set__ and Clr__ nodes that will allow both LatchSet__ and LatchClr__ to be asserted (driven low or true) at the same time.

Accordingly, it will be evident that in order to assert LatchSet__ or LatchClr__, thus toggling the Q and Q__ outputs of the circuit 2, certain state conditions must be met by the D1Set__, D0Set__ D1Clr__ and D0Clr__ inputs to the active overlap filter circuitry 8. The Set__ and Clr__ nodes can only be in opposite states from one another if both inputs to either AND gate U9 or AND gate U10 are in a 1 state, while there is at least one 0 appearing at the inputs to the opposite AND gate. This condition follows from the logical ORing function of AND gates U9 and U10. Specifically, for the Set__ node to beasserted (low), either D1Set__ or D0Set__ must be asserted (low), in an order for the Clr__ node to be low, either D1Clr__ or D0Clr__ must be asserted. While it may be implied from an understanding of the operation of AND gates, it bears mentioning that both DxSet__ or DxClr__ may be low in order to assert Set__ or Clr__ respectively.

Accordingly, in order to toggle the active overlap filter circuitry 8 and the output latch 10, thus toggling the Q and Q__ outputs of the circuit 2, it will be seen that either the D1Set__ and D0Set__ inputs must be toggled from either 0:0, 0:1, or 1:0, to a 1:1 state while the D1Clr__ and D0Clr__ inputs are toggled to either a 0:0, 0:1, or 1:0 state. In addition, it will be equally evident that LatchSet__ and LatchClr__ will flip states from the foregoing condition, if D1Clr__ and D0Clr__ are toggled to a 1:1 from any of the preceding states, and if D1Set_ and D0Set_ are toggled to a 0:0, 0:1, or 1:0.

Thus, the output conditions of the upper latch stack 4 and lower latch stack 6 are defined by the requirements of the active overlap filter circuitry 8 and the output latch 10. In addition to controlling toggling of the LatchSet_ and LatchClr_ lines, the active overlap filter circuitry 8 also functions in a manner to be described in greater detail below, to ensure that the LatchSet_ and LatchClr_ inputs to the output latch 10 are always stable with regard to changing states of the Set_ and Clr_ nodes, such that the circuit outputs Q and Q_ are "glitch" free. Briefly, as described above, input AND gates U9 and U10 logically OR the DxSet_ and DxClr_ signals provided by the upper and lower latch stacks. The output of these AND gates define signals Set_ and Clr_ respectively. However, as will be described in greater detail below, it is possible for Set_ and Clr_ to be active (i.e. true or 0) simultaneously for brief periods of time. The inverters 16 and 18 provided in conjunction with NAND gates U11 and U12 ensure that the control signals LatchSet_ and LatchClr_ are never asserted (i.e. low or true) simultaneously. Thus, "clean" inputs are always provided to the output latch 10 resulting in "glitch"-free operation of the circuit 2.

The operation of the dual clock edge triggered D-type flip flop (2 of FIG. 2) will now be described with reference to FIG. 3 which is a semi-schematic exemplary wave form diagram depicting the various states of various nodes of the circuit of FIG. 2.

Figure 3:
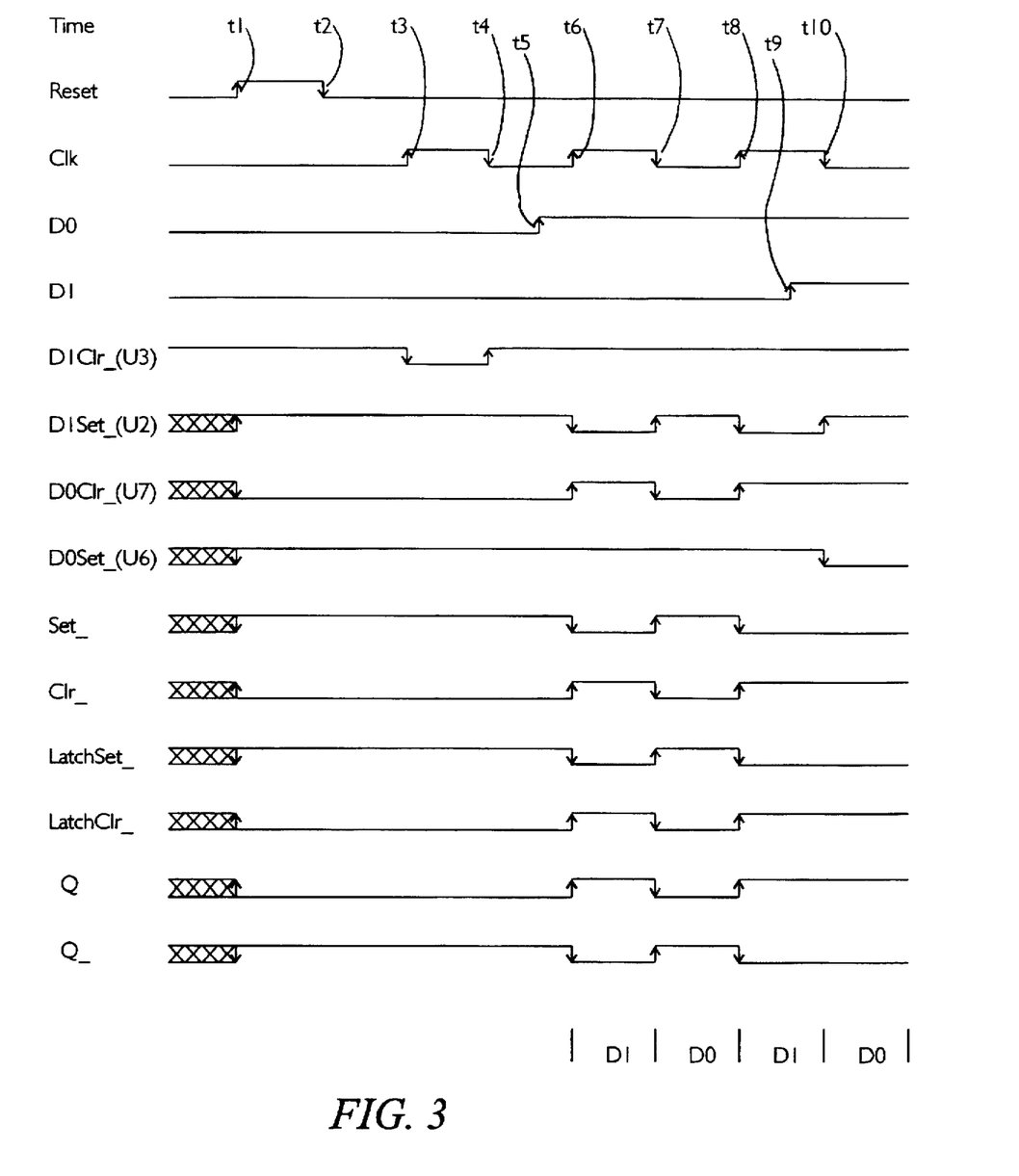
FIG. 3 is a semi-schematic exemplary wave form diagram depicting operation of the dual edge triggered flip flop of FIG. 2.
Figure 4:
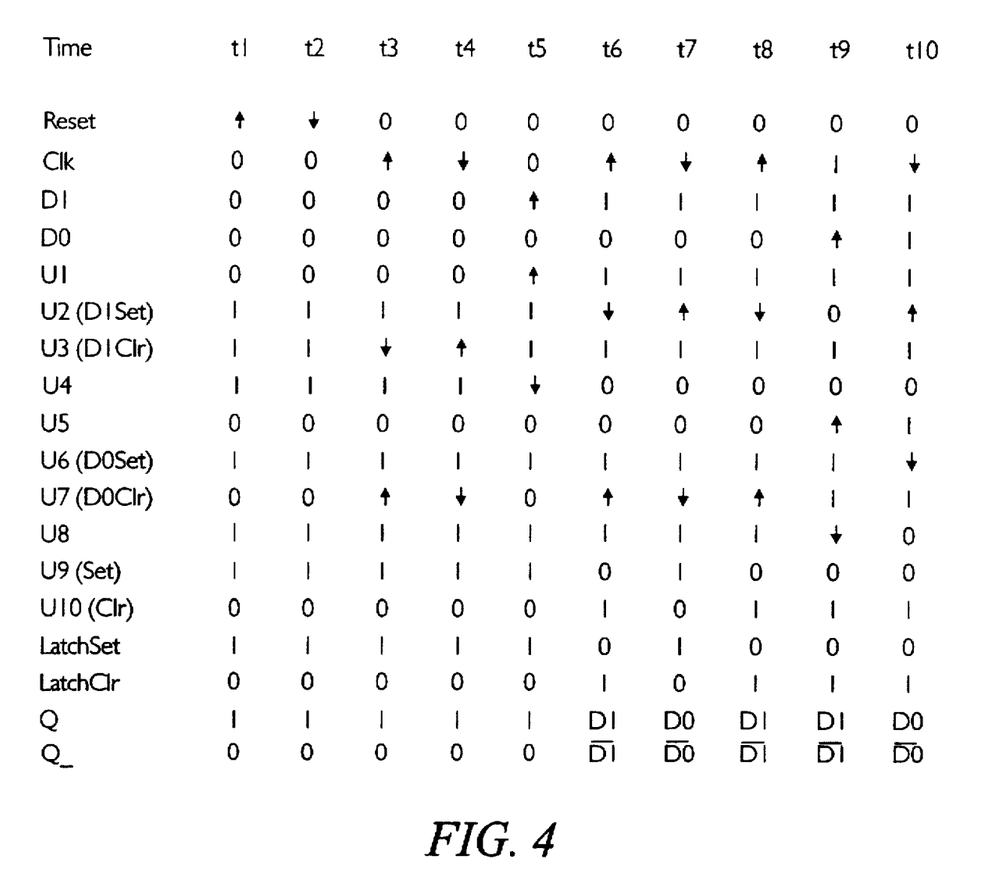
FIG. 4 is an exemplary state diagram and truth table of the dual edge triggered flip flop of FIG. 2, depicting the logic states of circuit nodes in accordance with the wave form diagram of FIG. 3.

Initially, in order to avoid any ambiguities in the initial states of any of the nodes of the circuit, the circuit is initially reset by taking the Reset input line high, which is depicted in both the wave form diagram of FIG. 3 and its accompanying state diagram and truth table of FIG. 4 at t1. In order to simplify the operational description of the circuit (2 of FIG. 2), it will be assumed that Clk and the two data input lines D1 and D0 are all held low.

When Reset is taken high, the reset signal, as it is distributed throughout the circuit, is low due to its being inverted by inverter 12. Accordingly, a low appearing at the inputs of NAND gates U2, U4, U6 and U8 will cause production of a 1 at the outputs. U2 and U6 being forced to a 1, causes D1Set_ and D0Set_ to be in a 1 state, thus forcing the Set_ node to a 1. A 0 on the Clk line, causes U3 to be forced to a 1 which is reflected on the D1Clr_ output. However, a 0 on the Clk line is inverted by inverter 14 to a 1 state and, thus a 1 is placed at one of the inputs of U7. The first input of U7 is controlled by the output of U6, which as previously discussed is a 1. Likewise, the output of U8 is a 1 because the data line D0 is held low. Accordingly, with three 1's at the inputs of U7, the output of U7 (D0Clr_) is forced to an active low, thus forcing the Clr_ node of the active overlap filter circuitry 8 to be forced to 0.

Following the description of the operation of the active overlap filter circuitry 8, above, the 1:0 condition on Set_ and Clr_ respectively forces LatchSet_ to a 1, while LatchClr_ is forced low.

It should be mentioned that the actual state of LatchClr_ is immaterial during the reset operation, because the Reset signal drags the third input of NAND gate U14 low, thus forcing the Q_ output to a 1 state regardless of the state of LatchClr_. With Q at 1, and LatchSet_ at 1, NAND gate U13 is forced to an active low condition and therefore, the Q output is 0. Accordingly, it will be evident that resetting the circuit functions to preset the Q and Q_ outputs to a 0 and a 1 respectively, in accordance with the first row of the circuit operational truth tables Table 1 and 2.

Once the circuit is reset, the reset line is dropped, placing a 1 on the respective reset inputs of NAND gates U2, U4, U6 and U8. Likewise, the third input of NAND gate U14 of output latch 10 is also at a 1, thus making the operational state of NAND gate U14 depend solely on the state of LatchClr_ and Q. The output latch 10 is thus conditioned to operate normally. It should be noted, that once the reset in put of U14 goes high, LatchClr_s being low functions to maintain the Q_ output in the 1 state which, in turn, functions to maintain the Q output at 0.

Taking the reset line low at time t2 in FIGS. 3 and 4, has no effect on the output states of the NAND gates of the upper latch stack 4, because the outputs of U2, U3 and U4 all remain in the 1 state because Clk and D1 are still 0. Likewise, U1 is driven to an active low by U2 and U4. In like manner, raising the reset inputs to the NAND gates of the lower latch stack 6 has no effect on the output states of NAND gates U5, U6, U7 and U8. U8 is forced to a 1 by D0 remaining low U5 remains at an active low which in turn, maintains U6 and thus, D0Set_ at a 1. U7, and thus D0Clr_ remains at an active low. Thus, at time t2, with Clk D1 and D0 all at a low, none of the internal nodes of the circuit (2 of FIG. 2) are seen to change state. Q remains 0 while Q_ remains 1.

Next, at time t3, in FIGS. 3 and 4, the Clk signal is brought high. It should be noted that in the exemplary embodiment, the data lines D1 and D0 remain low. Bringing the Clk line high causes the Clk phase to be inverted by inverter 14 into the lower latch stack 6, thus causing a 0 to be provided to the inputs of U6 and U7. U6 does not change state, and remains at a 1, because of the active low output of U5, however a 0 on the Clk input of U7 causes U7 and, thus D0Clr_ to change state from 0 to a 1.

With regard to the upper latch stack 4, raising Clk high does not change the output state of U2, because of the active low output of U1 which holds U2 high. However, raising Clk causes U3 and thus, D1Clr_to change state from a 1 to a 0. In like manner, with regard to lower latch stack 6, raising Clk causes the inverter 14 to provide a 0 to the inputs to U6 and U7. A 0 in the input of U6 does not cause U6 to change state, because of the active low output of U5, however a 0 in the input of U7 causes U7 and thus, D0Clr_ to change state from a 0 to a 1. U8 remains high, because the data line D0 is maintained at a low. Accordingly, it will be seen that a Clk rising edge cause D1 Clr_ and D0Clr_ to swap states, at least insofar as the data lines D1 and D0 are maintained at a low. From the foregoing, it will be evident that D1Set_ and D0Set_ are retained at a 1, thus, maintaining the Set_ node at a 1. Likewise, D1Clr_ and D0Clr_ merely swap states, thus maintaining the Clr_ node at a 0. Accordingly, no change is made to either LatchSet_ or LatchClr_, and thus the outputs Q and Q_ are maintained at 0 and 1 respectively.

Next, at time t4 in FIGS. 3 and 4, Clk is dropped low, while the data lines D1 and D0 are maintained at 0. In symmetry with the discussion above, the falling edge of Clk causes U3 and thus, the output D1Clr_ of the upper latch stack 4, to be forced high. Similarly, the Clk falling edge causes U7 and thus, the D0Clr_ of the lower latch stack 6, to change state from a 1 to a 0. Following the above discussion, D1Clr_ and D0Clr_ again merely swap states such that the Set_ node remains a 1, the Clr_ node remains 0, LatchSet_ remains a 1, LatchClr_ remains a 0, the Q output is maintained at 0, and the Q output remains at a 1.

At time t5, with Clk remaining low, the D1 data input is now taken to a 1, while the D0 input remains low. As can be seen from the exemplary wave form diagram of FIG. 3, raising D1 has no effect on the states of D1Set__, D1Clr__, D0Set__ and D0Clr__ and thus, the states of the remaining nodes in the circuit. However, as can be seen from the exemplary state diagram and truth table of FIG. 4, raising D1 uses NAND gate U4 of the upper latch stack 4 to change state from a 1 to a 0 which in turn, causes NAND gate U1 to change state from a 0 to a 1. The output of U1 is coupled to the first input of NAND gate U2 which now comprises two inputs at a 1 and whose output state is thus controlled by the state of Clk.

It will be evident from the foregoing that as NAND gate U4 drops to 0 caused by D1 going high, NAND gate U1 changes state in order to condition NAND gate U2 and thus D1Set__ to be toggled by the rising edge of Clk. Also, as NAND gate U4 drops to 0, this value is reflected on the third input of NAND gate U3 thus maintaining D1Clr__ at a 1 regardless of the state of Clk.

Returning now to FIG. 3, at time t6 Clk again goes high which causes NAND gate U2 and thus, D1Set__ to be forced to an active low. The output of NAND gate U3 and thus, D1Clr__ is maintained high by the 0 output of the NAND gate U4 as discussed previously. Also, as Clk goes high, the inverter 14 causes a 0 to appear at the Clk input to NAND gate U7 which in turn, causes U7 and thus, D0Clr__ to change state from a 0 to a 1. NAND gate U6 and thus, D0Set__ do not change state (D0Set__ is maintained at a 1).

It will be evident from the foregoing, that D1Set__ and D0Set__ are now in opposite states (0:1 respectively) rather than in the same (1:1) state. In addition, D1Clr__ and D0Clr__ are now in the same state (1:1) rather than in opposite states as previously. This condition now causes the Set__ node to go from a 1 to a 0 and, likewise the Clr__ node to go from a 0 to a 1. This in turn causes NAND gate U11 and thus LatchSet__ to be forced to an active low and NAND gate U12 and thus, LatchClr__to be forced high. A 0 on LatchSet__ causes NAND gate U13 to change state thus driving the Q output to a 1 and, because the Q output is coupled to the first input of NAND gate U14, U14 and thus Q__ is now driven to a 0.

In accordance with practice of principles of the invention, it can be seen that the value of D1 has been latched to the Q output (a1) and its inverse (a0) has been latched to the Q__ output by the rising edge of Clk.

The next exemplary event in the exemplary wave form diagram of FIG. 3 occurs at time t7, where Clk is dropped from a 1 to a 0. In the example of t7, D1 is maintained at a 1 and D0 remains a 0. On the falling edge of Clk, a 0 is provided to the third input of NAND gate U2 causing its output and thus, D1Set__ to go from a 0 to a 1. Because the output of NAND gate U4 remains a 0, the falling edge of Clk causes no change to the output of NAND gate U3 and thus D1Clr__, which remains high. The falling edge of Clk which is inverted to a rising edge by inverter 14, causes NAND gate U7 and thus D0Clr__ to change state from 1 to 0. D0Set__ remains high, because the output of NAND gate U5 is maintained at an active low, because D0 has not caused U8 to force U5 to change its state.

Accordingly, as would follow from the preceding discussion, D1Clr__ and D1Set__ are now in the same high state causing the Set__ node to return high in turn causing LatchSet__ to go high. Likewise, D1Clr__ and D0Clr__ are now in opposite states (1:0 respectively) which causes the Clr__ node to drop from a 1 to a 0 which, in combination with Set__ going high causes NAND gate U12 and thus LatchClr__ to be forced low. LatchClr__ going low forces Q to go to a 1 which, in combination with LatchSet__ at a 1 forces Q to go to 0.

It can be thus seen that the value of D0 (a0) is latched to the Q output while its inverse (a1) is latched to the Q__ output on the falling edge of Clk.

At the next step of the exemplary wave form diagram of FIG. 3 and the exemplary state diagram and truth table of FIG. 4 (time t8), Clk is again taken high with D1 at a 1 and D0 at a 0. As before, the rising Clk edge causes the D1Set__ output of U2 to fall, while the D1Clr__ output of U3 remains high. Also, the rising Clk edge causes the D0Clr__ output of U7 to go to a 1, while the D0Set__ output of U6 remains 1. The 0:1 output conditions of D1Set__ and D0Set__ respectively, causes the Set__ node to go to 0 while the 1:1 output conditions of D1Clr__ and D0Clr__ respectively cause AND gate U10 to force the Clr__ node to a 1. This condition in turn, causes LatchSet__ and LatchClr__ to be 0 and 1 respectively, thus forcing the Q and Q__ outputs to a 1 and 0.

As before, D1 has been latched to the outputs of the circuit 2 with Q rising to a 1 and Q__ falling to a 0.

Now, however at time t9, D0 is brought high prior to Clk being dragged low. D0 going up causes NAND gate U8 to change state from a 1 to a 0 which in turn, causes NAND gate U5 to change its state from a 0 to a 1. This has the effect of pre-conditioning NAND gate U6 to have its output, D0Set__, change state when Clk toggles. Because the high Clk signals inverted through inverter 14, U6 and U7 both remain in a 1 state, no further change occurs in the circuit 2.

Now, at t10 Clk toggles low which causes NAND gates U2 and U3 of the upper latch stack 4 to go high. D1Set__ is thus driven from a 0 to a 1, while D1Clr__ remains high. Conversely, the falling edge of Clk now causes NAND gate U6 of the lower latch stack 6 to change state from a 1 to a 0. This 0 output (D0Set__ is reflected to the first input of NAND gate U7, which causes its output (D0Clr__ to remain high.

Accordingly, D0Set__ going low forces NAND gate U9 to drive the Set__ node low (in the example, the Set__ node remains low) while the high D1Clr__ and D0Clr__ outputs causes AND gate U10 to maintain the Clr__ node at a 1. This condition causes LatchSet__ to remain 0, while LatchClr__ remains 1 and D0 has now been latched to the outputs of the circuit 2 with the Q output remaining 1 and the Q output remaining 0.

It will be evident from the foregoing examples, that the upper latch stack 4 functions to provide D1Set__ and D1Clr__ outputs such that if D1 contains data (defined in the exemplary embodiment as a 1), then at the rising edge of Clk, D1 Set__ is 0 while D1Clr__ is a 1. If, at the rising edge of Clk, there is no data on D1 (i.e., D1 is 0) then, D1Clr__ is a 0, while D1Set__ is a 1. It can be further seen that regardless of the state of the D1 input to the upper latch stack 4, a falling Clk edge will force both the D1Set__ and the D1Clr__ outputs to a 1 state.

Conversely, on the falling edge of the Clk signal, D0Set__ is a 0 and D0Clr__ is a 1 if there is data on the D0 input. If there is no data on the D0 input, then on a Clk falling edge D0Clr__ will be a 0 while D0Set__ will be a 1. As was the case for the upper latch stack 4, the D0Set__ and D0Clr__ outputs of the lower latch stack 6 will both be forced to a 1 state on a Clk rising edge regardless of the state of the D0 input.

Accordingly, as can be seen from the following exemplary truth table, Table 3,

TRUTH TABLE 3

| D0 | D1 | Clk | D1Set_ | D0Set_ | D1 Clr_ | D0 Clr_ | Set_ | Clr_ | Q | Q_ |
|---|---|---|---|---|---|---|---|---|---|---|
| X | 1 | ↑ | 0 | 1 | 1 | 1 | 0 | 1 | 1 | 0 |
| 1 | X | ↓ | 1 | 0 | 1 | 1 | 0 | 1 | 1 | 0 |
| X | 0 | ↑ | 1 | 1 | 0 | 1 | 1 | 0 | 0 | 1 |
| 0 | X | ↓ | 1 | 1 | 1 | 0 | 1 | 0 | 0 | 1 | in order for data to be latched to the outputs of the circuit 2, the two Set_ inputs to the active overlap filter circuitry 8, need to be in opposite states, while the two Clr_ inputs both need to be 1's. When data appears at either the D1 or the D0 inputs to the circuit, the two Clr_ inputs (D1Clr_ and D0Clr_ are both forced to ones on the rising and the falling edge of Clk, while the two Set_ inputs are placed in opposite states. However, on the rising edge of Clk D1Set_ is a 0, while D0Set_ is a 0 on the falling edge of Clk. Either of these conditions is sufficient to force the Q output to 1 and the Q_ output to 0.

Also, if there is no data on D1 or D0, the rising and falling Clk edges cause the Clr_ outputs (D1Clr_ and D0Clr_) to change states as opposed to the Set_ outputs. Accordingly, LatchClr_ is driven to a 0 which in turn, forces Q_ to a 1 and Q to a 0.

Thus, in accordance with practice of the present invention, means suitably comprising the upper and lower latch stacks 4 and 6 respectively, have been described which provide two pairs of outputs, one pair from each latch stack with the first pair indicating the presence of data on either the first or second input when the first pair is in opposite states and the second pair is in like states. Further, it can be seen that data is present on the first input when the first pair is in a first unlike condition (i.e., 0:1) and data is present on the second input when the first pair is in a second unlike condition (opposite the first (i.e., 1:0). It will be further understood that the second pair of outputs exhibits the aforementioned unlike state conditions while the first pair exhibits like state conditions when data is absent from the data inputs. Whether either unlike pair is in the first (0:1) unlike state or the second (1:0) unlike state depends on whether the clock edge is rising or falling. When data is present on both D1 and D0 inputs to the circuit 2, it will be understood that the D1Set_ and D0Set_ inputs to AND gate U9 of active overlap filter circuitry 8 will be changing state each time Clk rises and falls. In addition, if one of the data inputs contain data while the other was empty, not only would the inputs to U9 or U10 change state, but Set_ and Clr_ would also change state with either the rising or falling edge of Clk.

It can be seen that these conditions could easily give rise to instabilities in the output latch 10 if the Set_ and Clr_ nodes did not change state at exactly the same time. As one node transitions from a 0 to a 1 for example, the other node may remain at a 1 for a short period of time before it transitions to a 0. This may be easily caused by internal delays in the circuit elements which comprise the circuit 2 local heating, setup and hold times for the components of either the upper or lower latch stacks, and the like. In order to avoid such instability and to ensure that LatchSet_ and LatchClr_ are not triggered until both the Set_ and Clr_ nodes are stable, the circuit 2 includes active overlap filter circuitry 8 for accomplishing such function.

Figure 5:
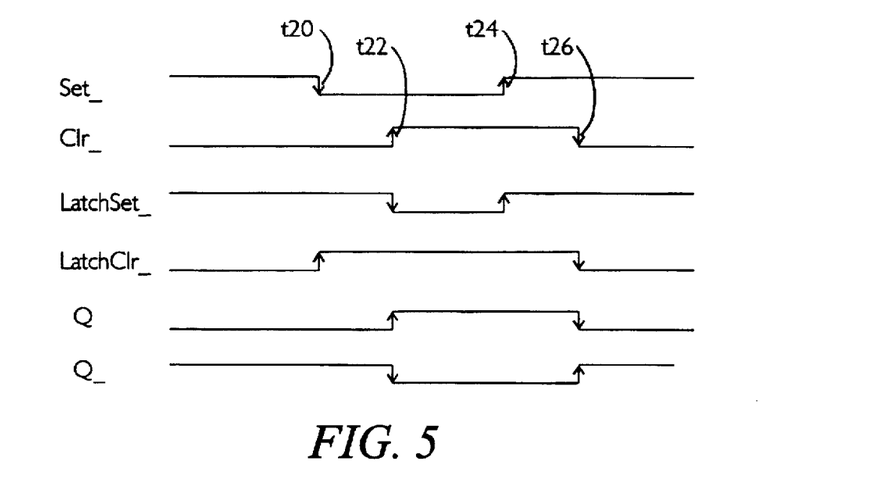
FIG. 5 is a semi-schematic, exemplary wave form diagram depicting operation of the instability protection logic of the circuit of FIG. 2 in accordance with practice of the invention.

Turning now to FIG. 5, there is depicted an exemplary wave form diagram of the operation of the instability protect logic portion of the circuit 8. Operation of the stability protect logic circuitry can be understood with reference to the wave form diagram of FIG. 5 and the circuit diagram of FIG. 2. In FIG. 5, it is assumed that the Set_ node of the protect logic circuitry 8 is initially high, while the Clr_ node is initially low. Accordingly, LatchSet_ is high and LatchClr_ is initially low.

Now, at time t20, the Set_ node is taken low by for example, one of the Set_ outputs of the latch stacks going to 0. However, at time t20, the Clr_ node remains low due perhaps to a slow setup and hold time in a preceding portion of the circuit. This intermediate condition (both Set_ and Clr_ low) causes NAND gate U12 to change state which forces LatchClr_ to a 1. However, LatchSet_ remains high because the Clr_ node has not yet risen. Because a 0 had been previously latched to the Q output of output latch 10, NAND gate U14 has a 0 at one of its inputs which maintains the Q output in a 1 state, regardless of the state of LatchClr_. When Q and LatchSet_ are both high, NAND gate U13 is maintained at an active low.

Now, at time t22 the Clr_ node rises to a 1 which has the immediate effect of changing the output state of NAND gate U11 (LatchSet_ to an active low. This in turn, forces NAND gate U13 and thus, the Q output to a 1 which in turn changes the final remaining input to NAND gate U14 to a 1 driving U14 (Q_)to a 0 in response.

Likewise, the condition where the Set_ node returns high while Clr_ remains high is indicated at time t24 in FIG. 5. The effect of Set_ going high puts a 0 on the input of NAND gate U11 which drives LatchSet_ to a 1. However, since Clr_ remains high, a 0 (through inverter 18) remains on the input of NAND gate U12 which keeps LatchClr_ at a 1 and which maintains Q_ at a 0. This in turn keeps the Q output in a 1 state unless and until Q_ is forced to 1.

This condition occurs at time t26 when the Clr_ node drops to 0 forcing LatchClr_ to 0 and Q_ to 1.

Thus, from the preceding example, the states of the Q and Q_ outputs are controlled by the last arriving state change of either the Set_ or Clr_ nodes. In the preceding example, the Clr_ node held the later of the two arriving signal changes but it will be evident that if the Clr_ node changed state first, the Set_ node would control the timing of the outputs Q and Q_. Moreover, it will be evident to one having skill in the art that Set_ may trigger early, followed by Clr_ and then Clr_ may trigger back followed by Set_. In that case, output timing would be controlled first by the Clr_ state change and then next by the Set_ state change.

Thus, it will be evident that means have been provided to ensure that the output latch 10 and the outputs Q and Q_ will not change state unless and until both Set_ and Clr_ nodes have changed state. Such means suitably comprise a pair of NAND gates with each NAND gate having one input directly coupled to one of the nodes (Set_ or Clr) and the other input coupled to the opposite node through an inverter.

In accordance with practice of principles of the present invention, a D-type flip flop has been described which is able to double data throughput, through the circuit, by clocking data to the outputs on both the rising and the falling edge of a periodic clock signal. The dual clock edge triggering flip flop is configured to be connected to two data streams each on a separate data input, or alternatively be connected to a single data stream by tying the two data inputs together. Although the circuit is depicted and has been described in terms of NAND gates with active low outputs, it will be evident to one having skill in the art that such a circuit may be easily accomplished by logic gates having active high outputs. In addition, the phases of the Q and Q_ outputs may be reversed by substituting NOR gates for the two AND gates in the active overlap filter circuitry 8, and making suitable changes to the output latch 10.

It is contemplated that the dual clock edge triggering flip flop be implemented as a single monolithic CMOS integrated circuit, but it will be recognized that this is merely a convenient design choice. A circuit having identical functionality may be implemented in bipolar technology and with individual discrete transistors as opposed to a monolithic integrated circuit.

The above description of an exemplary embodiment of a dual clock edge triggering D-type flip flop is for illustrative purposes. Because of variations which will be apparent to one having skill in the art, the present invention is not intended to be limited to the particular embodiment described above. Such variations and other modifications and alterations are including within the scope and intent of the invention as described in the following claims.

What is claimed is:

1. An integrated circuit for latching data in operative response to a clock signal, said clock signal defining alternating rising and falling edge transitions, the circuit comprising:

a first data input;

a second data input;

a first latch stack connected to receive a first data signal on the first data input and operatively responsive to the clock signal, the first latch stack for producing a first pair of output signals;

a second latch stack connected to receive a second data signal on the second data input and operatively responsive to the clock signal, the second latch stack for producing a second pair of output signals;

a filter for logically combining the first and second pair of output signals to form thereby a third pair of signals; and an output latch, operatively responsive to the third pair of signals, the output latch having an output, wherein data on the first data input is latched to the output on the clock rising edge transition, and wherein data on the second data input is latched to the output on the clock falling edge transition.

2. The integrated circuit of claim 1, wherein each respective one of the first pair of output signals comprises a first, logically high, state and a second, logically low state, and wherein each respective one of the second pair of output signals comprises a first, logically high, state and a second, logically low, state, and wherein the second pair of output signals indicates the logical absence of data on either the first or second data input.

3. The integrated circuit of claim 1 wherein each respective one of the third pair of signals defines a first, logical high, state and a second, logical low, state, the output latch defining a first output state when the third pair of signals is in a first unlike condition, the output latch defining a second output state opposite the first, when the third pair of signals are in a second unlike condition, opposite the first unlike condition.

4. The integrated circuit of claim 6, the filter further comprising:

active overlap circuitry, for preventing the output latch from changing output states until each respective one of the third pair of signals has completed transitioning from a first logical state to a second logical state, opposite the first.

5. The integrated circuit of claim 2, wherein the first pair of output signals produced by the first latch stack comprises a first set signal and a first clear signal, and wherein the second pair of output signals produced by the second latch stack comprises a second set signal and a second clear signal.

6. The integrated circuit according to claim 5, wherein the third pair of signals formed by the filter comprises a third set signal and a third clear signal, wherein the filter logically combines the first set signal and the second set signal to form the third set signal, and wherein the filter logically combines the first clear signal and the second clear signal to form the third clear signal.

7. The integrated circuit according to claim 6, the filter further comprising active overlap circuitry, operatively responsive to the third set signal and the third clear signal, the active overlap circuitry configured to condition the third set and third clear signals such that they may not be asserted simultaneously.

8. An integrated circuit for latching data in operative response to a clock signal, said clock signal defining alternating rising and falling edge transitions, the circuit comprising:

first latch means, connected to receive a first data signal on a first data input, the first latch means operatively responsive to the clock signal for producing a first pair of output signals;

second latch means, connected to receive a second data signal on a second data input, the second latch means operatively responsive to the clock signal for providing a second pair of output signals;

filter means for receiving the first and second pair of output signals, the filter means further for logically combining the first and second pair of output signals to cause production of a third pair of signals; and output means for generating an output signal in operative response to the third pair of signals, wherein the first data signal defines the output signal on the rising edge transition of the clock signal, and wherein the second data signal defines the output signal on the falling edge transition of the clock signal.

9. The integrated circuit of claim 8, wherein each of the first and second pair of output signals from the first and second latch means, respectively, comprises a first set signal and a second clear signal, the filter means combining each respective first set signal to cause production of a third set signal, the filter means further combining the second clear signals to cause production of a third clear signal.

10. The integrated circuit of claim 9, wherein the filter means comprises a first and second logical ORing function, the first logical ORing function for combining respective ones of the first SET signals to cause production of the third set signal, the second logical ORing function combining respective ones of the second clear signals to cause production of the third clear signal.

11. The integrated circuit of claim 10, wherein each respective logical ORing function is performed by an AND gate.

12. The integrated circuit of claim 11, the output signal of the output means comprising first and second complimentary outputs, wherein the first output is set when the third set signal is asserted, and wherein the second output signal is set when the third clear signal is asserted.

13. The integrated circuit of claim 12, wherein the filter means further comprises means for preventing the third set signal and the third clear signal from occurring simultaneously.

14. An integrated circuit for latching data in operative response to a clock signal, said clock signal defining alternating and opposite-going spaced-apart edge transitions, the circuit comprising:

first and second data inputs for carrying first and second data signals;

an output latch defining first and second complimentary outputs, the output latch operatively responsive to a set input and a clear input to thereby define said first and second complimentary outputs with respect to said first and second data signals; and circuit means connected between the first and second data inputs and said output latch, the circuit means for defining the set input and clear input, the circuit means further connected to the clock signal for commanding the first output to the first data signal on a first clock transition edge, and for commanding the first output to the second data signal on a next clock transition edge opposite-going to the first clock transition edge.

15. The integrated circuit of claim 14, wherein the first output is set and the second, complimentary output, is cleared when the set input is asserted and the clear input is not asserted, and wherein the second output is set and the first, complimentary output, is cleared when the clear input is asserted and the set input is not asserted.

16. The integrated circuit of claim 15, further comprising filter means for preventing the set input and the clear input to the output latch from being asserted simultaneously.

17. The integrated circuit of claim 16, the circuit means further comprising:

a first latch stack connected to the first data input for receiving the first data signal and operatively responsive to the clock signal, the first latch stack for producing a first pair of output signals;

a second latch stack connected to the second data input for receiving the second data signal and operatively responsive to the clock signal, the second latch stack for producing a second pair of output signals.

18. The integrated circuit of claim 17, the filter means further for logically combining the first and second pair of output signals from the first and second latch stack to form thereby a third pair of signals.

19. The integrated circuit of claim 18, wherein the third pair of signals comprises the set input and the clear input to the output latch.

* * * * *